US009047876B2

(12) United States Patent
Koike

(10) Patent No.: US 9,047,876 B2
(45) Date of Patent: Jun. 2, 2015

(54) AUDIO DEVICE

(75) Inventor: Hiroyuki Koike, Kanagawa (JP)

(73) Assignee: PANASONIC INTELLECTUAL PROPERTY MANAGMENT CO., LTD., Osaka (JP)

( * ) Notice: Subject to any disclaimer, the term of this patent is extended or adjusted under 35 U.S.C. 154(b) by 296 days.

(21) Appl. No.: 13/637,765

(22) PCT Filed: Mar. 25, 2011

(86) PCT No.: PCT/JP2011/001757

§ 371 (c)(1), (2), (4) Date: Sep. 27, 2012

(87) PCT Pub. No.: WO2011/121955

PCT Pub. Date: Oct. 6, 2011

(65) Prior Publication Data

US 2013/0016856 A1 Jan. 17, 2013

(30) Foreign Application Priority Data

Mar. 30, 2010 (JP) ................................ 2010-078518

(51) Int. Cl.
*H03G 5/00* (2006.01)
*G10L 21/038* (2013.01)

(52) U.S. Cl.
CPC ................................... *G10L 21/038* (2013.01)

(58) Field of Classification Search
CPC ........ H04R 3/04; H04R 2430/03; H04R 1/20; H03G 5/165; H04S 7/307
USPC ........................................... 381/98, 103, 106
See application file for complete search history.

(56) References Cited

U.S. PATENT DOCUMENTS

2003/0165245 A1* 9/2003 Lau ................................ 381/98
2003/0233234 A1 12/2003 Truman et al.

(Continued)

FOREIGN PATENT DOCUMENTS

EP 0706299 A2 4/1996
JP 06-035463 A1 2/1994

(Continued)

OTHER PUBLICATIONS

International Search Report for PCT/JP2011/001757 dated Apr. 26, 2011.

(Continued)

*Primary Examiner* — Alexander Jamal
(74) *Attorney, Agent, or Firm* — Pearne & Gordon LLP

(57) ABSTRACT

Disclosed is an audio device that plays back compressed audio signals that can be sufficiently comfortable to be audible even in a play back environment with improved acoustic quality. In order to correct a weak signal component near a frequency with a high output level of a compressed audio, weak-signal component adding unit (121) extracts a specific frequency region based on input audio signals, generates a weak-signal component composed of harmonics signals composed of a harmonic component and the like, and a noise signal and adds the generated weak-signal component to the input audio signal. In order to correct a high-frequency band output level from which compressed audio signals are omitted, high-frequency band audio adding unit (122) generates audio of a high-frequency band composed of a harmonic signal and a noise signal and adds the generated high-frequency band audio to the input audio signal.

5 Claims, 3 Drawing Sheets

(56) References Cited

U.S. PATENT DOCUMENTS

| | | | | |
|---|---|---|---|---|
| 2010/0080401 | A1* | 4/2010 | Holmi et al. | 381/86 |
| 2010/0198587 | A1* | 8/2010 | Ramabadran et al. | 704/205 |

FOREIGN PATENT DOCUMENTS

| | | | |
|---|---|---|---|
| JP | 06-035463 | A1 | 10/1994 |
| JP | 07-184298 | A | 7/1995 |
| JP | 09-36685 | A | 2/1997 |
| JP | 10-224887 | A1 | 8/1998 |
| JP | 2007-282089 | A | 10/2007 |
| JP | 2008-048372 | A | 2/2008 |
| WO | 2009/029037 | A1 | 3/2009 |

OTHER PUBLICATIONS

European Search Report for Application No. 11762207.6-1910/ 2555192 PCT/JP2011001757 dated Aug. 23, 2013.

* cited by examiner

AUDIO DEVICE

TECHNICAL FIELD

The present invention relates to an audio apparatus that plays back a compressed audio signal.

BACKGROUND ART

A music playback apparatus typified by an iPOD (registered trademark), SD-Audio, or the like, uses audio compression technology MP3 (MPEG Audio Layer 3) or the like in order to reduce the size of a data file, and a high-frequency region that cannot be strongly sensed by the human ear—for example, audio of 20 kHz or above—or a weak signal close to a frequency with a high output level is compressed in recording. Consequently, with a conventional audio apparatus, a high-frequency audio range lost due to audio signal compression is reconstituted in a pseudo fashion (see Patent Document 1, for example).

CITATION LIST

Patent Literature

PTL 1

Patent Document 1: Japanese Patent Application Laid-Open No. 9-36685

SUMMARY OF INVENTION

Technical Problem

However, when a compressed audio signal is played back in a closed space such as the interior of a vehicle, due to the number and layout of speakers in the vehicle, and with improvements in the acoustic quality of an audio playback apparatus, correction of high-frequency region audio alone results in noticeable acoustic quality degradation, and does not enable the acoustic quality of audio prior to compression to be approached.

It is an object of the present invention to provide an audio apparatus that plays back a compressed audio signal that can be sufficiently comfortable to be audible even in a playback environment with improved acoustic quality.

Solution to Problem

An audio apparatus of the present invention has a compressed audio signal as input, and employs a configuration having: a weak signal component adding section that generates a weak signal component that is not included in the compressed audio signal, and adds the generated weak signal component to the compressed audio signal; and a high-frequency hand audio adding section that generates high-frequency band audio that is not included in the compressed audio signal, and adds the generated high-frequency band audio to the compressed audio signal.

Advantageous Effects of Invention

According to the present invention, a compressed audio signal being played back can be sufficiently comfortable to be audible even in a playback environment with improved acoustic quality.

DESCRIPTION OF EMBODIMENT

Now, an embodiment of the present invention will be described in detail with reference to the accompanying drawings.

Embodiment

Figure 1:
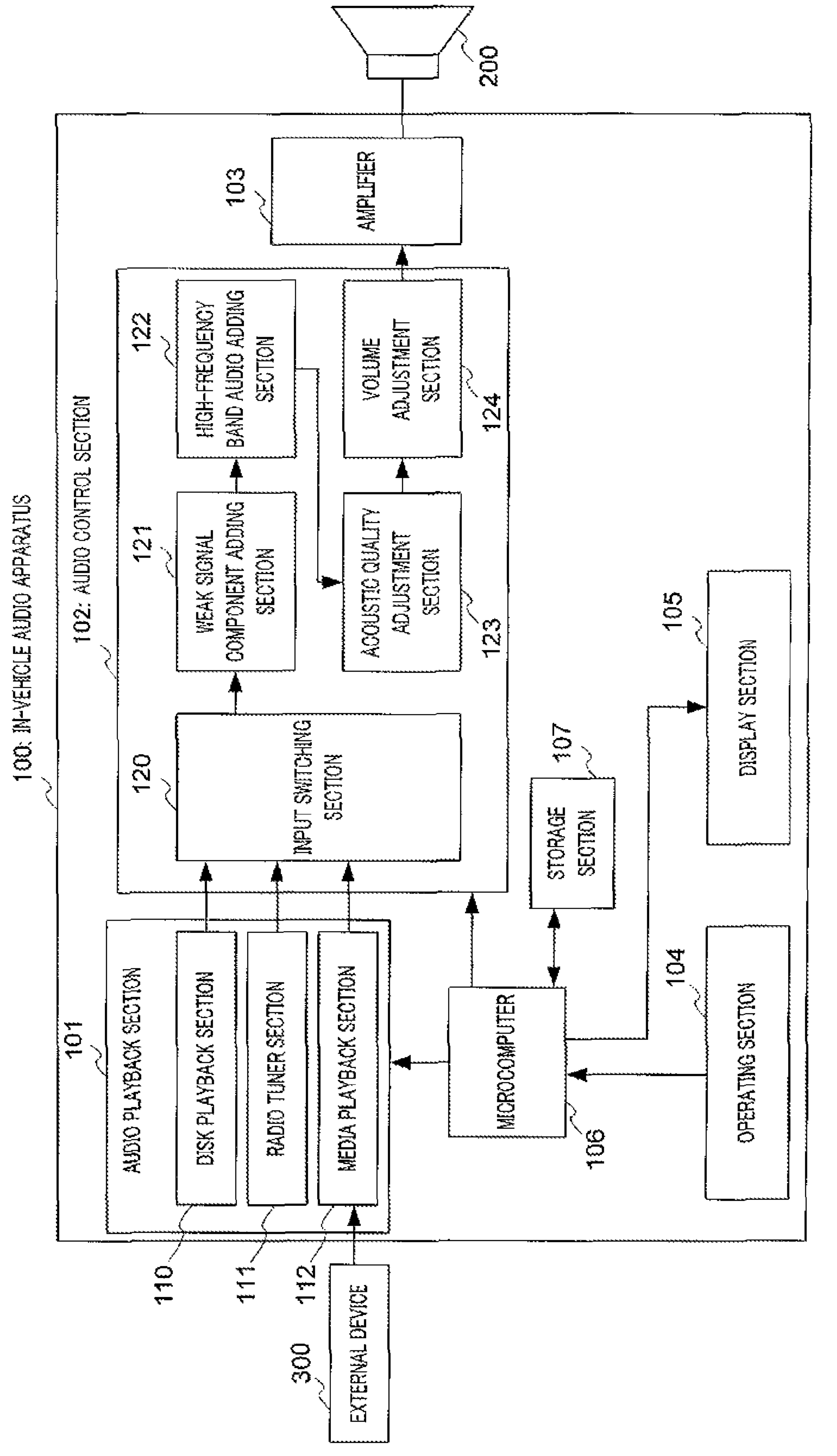
FIG. 1 is a block diagram showing a configuration of an in-vehicle audio apparatus according to an embodiment of the present invention.

FIG. 1 is a block diagram showing the configuration of in-vehicle audio apparatus 100 according to an embodiment of the present invention. As shown in FIG. 1, in-vehicle audio apparatus 100 is a general audio apparatus or navigation apparatus, and is connected to speaker 200 and external device 300.

Speaker 200 is connected to amplifier 103 of in-vehicle audio apparatus 100, and performs audio output of an audio signal outputted from amplifier 103. External device 300 is an SD card (Secure Digital memory card), HDD, USB memory, or the like, and is connected to media playback section 112 of in-vehicle audio apparatus 100.

A BUS device is included in external device 300, and the BUS device may be connected to microcomputer 106, which is the main control section of in-vehicle audio apparatus 100, and input switching section 120 of audio control section 102.

In-vehicle audio apparatus 100 is provided with audio playback section 101, audio control section 102, amplifier 103, operating section 104, display section 105, microcomputer 106, and storage section 107.

Audio playback section 101 is provided with disk playback section 110, radio tuner section 111, and media playback section 112, and media playback section 112 is connected to external device 300. Audio playback section 101 outputs radio broadcast audio, reproduced sound of audio information recorded on a disk-shaped recording medium such as a CD (Compact Disc) or DVD (Digital Versatile Disc), and reproduced sound of audio information recorded on a recording medium in external device 300.

Audio control section 102 is provided with input switching section 120, weak signal component adding section 121, high-frequency hand audio adding section 122, acoustic quality adjustment section 123, and volume adjustment section 124, and is connected to microcomputer 106, which is the main control section that controls these sections. Also, volume adjustment section 124 is connected to amplifier 103.

Audio control section 102 is an LSI having a so-called DSP (Digital Signal Processor) function or a circuit connecting individual ICs having separate functions, and is provided with major functions such as signal processing, A/D (Analog-Digital) conversion, D/A (Digital-Analog) conversion, and volume adjustment.

The configuration of each section of audio control section 102 is described below. Input switching section 120 selects audio from among audio outputted from audio playback section 101 according to a signal from microcomputer 106, and outputs the selected audio to weak signal component adding section 121.

In order to correct a weak signal component close to a frequency with a high output level of a compressed audio signal, weak signal component adding section 121 extracts a specific frequency region (for which the immediately previous output level is large and the immediately subsequent output level is close to 0) based on an inputted audio signal. Weak signal component adding section 121 generates a weak signal component including a harmonics signal including a high harmonic component or the like or a noise signal in the extracted specific frequency region by means of half-wave rectification and waveform clipping, and adds that generated weak signal component to the inputted audio signal (compressed audio signal). Weak signal component adding section 121 outputs the audio signal to which the weak signal component has been added to high-frequency band audio adding section 122.

High-frequency band audio adding section 122 corrects the output level of a high-frequency hand omitted from a compressed audio signal. Specifically, based on an inputted audio signal, high-frequency band audio adding section 122 generates high-frequency band audio including a harmonics signal including a high harmonic component or the like or a noise signal by means of half-wave rectification and waveform clipping, and adds the generated high-frequency band audio to the inputted audio signal. High-frequency band audio adding section 122 outputs the audio signal to which the high-frequency band audio has been added to acoustic quality adjustment section 123. Full-band noise such as white noise may also be added as the high-frequency band audio.

Enabling the functions of weak signal component adding section 121 and high-frequency band audio adding section 122 (hereinafter, these functions are referred to as "acoustic quality correction") is limited to compressed audio playback. Therefore, the acoustic quality correction is not applied to CD-DA (Compact Disc Digital Audio) playback, or to radio, for which audio correction is difficult. In this case, microcomputer 106 determines what kind of file in what medium is being played back, turns off the functions of weak signal component adding section 121 and high-frequency band audio adding section 122, and directs audio control section 102 to pass the input audio through the adding sections without the functions. Audio control section 102 can switch between an acoustic quality correction mode in which acoustic quality correction of a compressed audio signal is performed and a normal mode in which acoustic quality correction of a compressed audio signal is not performed even for a compressed audio signal according to a directive of microcomputer 106.

Acoustic quality adjustment section 123 performs acoustic quality adjustments such as equalizing, low-tone range adjustment, high-tone range adjustment, front/back volume balance, and left/right audio balance, and executes signal processing on an audio signal outputted from high-frequency band audio adding section 122 for adjustment to a desired acoustic quality. Acoustic quality adjustment section 123 outputs this audio signal whose acoustic quality has been adjusted to volume adjustment section 124.

Volume adjustment section 124 adjusts the volume of the audio signal whose acoustic quality has been adjusted by acoustic quality adjustment section 123, and outputs the signal to amplifier 103.

Amplifier 103 amplifies audio controlled by audio control section 102, and outputs the audio to speaker 200.

Operating section 104 includes switches for enabling a user to switch between various operations, such as switching between playing back a disk of audio playback section 101 or listening to the radio, setting the volume level for audio output, and so forth.

Display section 105 displays, for example, the title, track number, and playback time of music being played back, the frequency of a radio broadcasting station outputting audio, and so forth, as well as displaying the contents of an operation via operating section 104.

Microcomputer 106 performs overall control processing for in-vehicle audio apparatus 100. Microcomputer 106 determines what audio in audio playback section 101 is being played back, and turns off the functions of weak signal component adding section 121 and high-frequency band audio adding section 122 for an audio signal such as a CD-DA or radio for which audio quality correction is unnecessary or ineffective. Furthermore, in compressed audio playback, microcomputer 106 reads an optimal control parameter from storage section 107, and sets that parameter, based on a combination of the file type (MP3, WMA (Windows Media Audio), AAC (Advanced Audio Coding), etc.) and compression rate.

Storage section 107 stores necessary program software for starting in-vehicle audio apparatus 100, various values set by the user, settings of normal mode in which acoustic quality correction is not performed, a parameter table suitable for combinations of file type and compression rate, and so forth.

Figure 2:
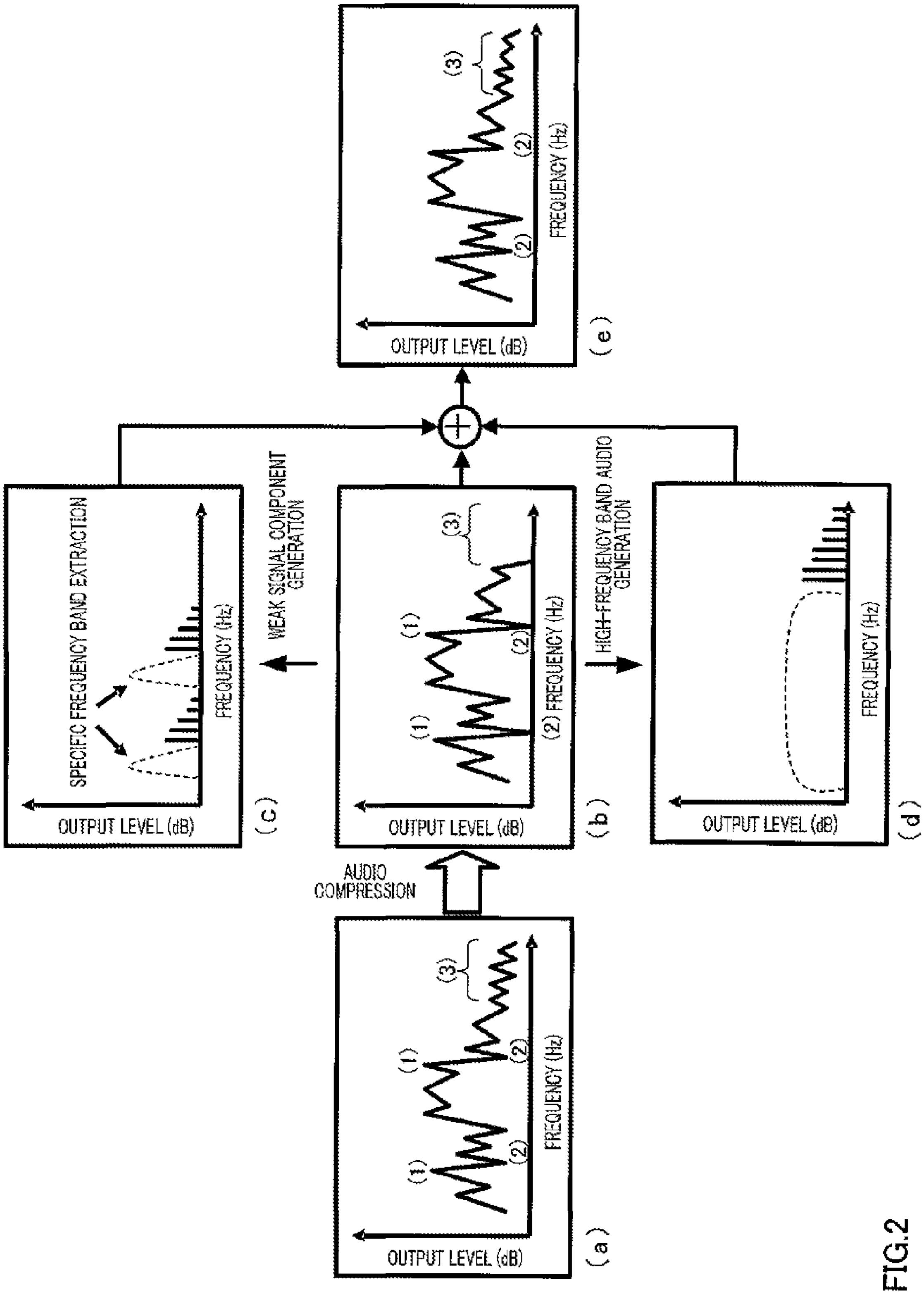
FIG. 2 is a drawing schematically showing the operation of the weak signal component adding section and high-frequency hand audio adding section shown in FIG. 1.

Here, the operation of above-described weak signal component adding section 121 and high-frequency band audio adding section 122 will be described using FIG. 2. FIG. 2 (*a*) is a drawing showing an audio signal waveform prior to audio compression, in which the horizontal axis indicates frequency and the vertical axis indicates the output level. The horizontal axis and vertical axis in FIG. 2 (*b*) through (*e*) are the same as in FIG. 2 (*a*).

As shown in FIG. 2 (*b*), audio compression is performed such that a sound source is obtained by omitting weak signal parts (2) close to a frequency with a large output level and by compressing audio (3) in a high-frequency region which cannot be strongly sensed by the human ear.

Thus, in order to correct the weak signal component close to a frequency with a large output level of parts (1) of the compressed signal shown in FIG. 2 (*b*), weak signal component adding section 121 extracts a specific frequency region (in which the immediately previous output level is large and the immediately subsequent output level is close to 0) based on the inputted audio signal, as shown in FIG. 2 (*c*), generates weak signal components (parts (2) in FIG. 2 (*b*)) including a harmonics signal including a high harmonic component or the like or a noise signal by means of half-wave rectification and waveform clipping, and adds these generated components to the compressed signal (inputted audio signal).

Weak signal component adding section 121 has a level detector, and generates a weak signal component when an input level greater than or equal to a determined value is detected. For example, if an input signal greater than or equal to −20 dB is detected when the maximum level of an input signal has been set to 0 dB, weak signal component adding section 121 generates a harmonic component (weak signal component) of this input signal, and adds this to audio inputted at a signal level equivalent to −50 dB. By this means, a signal component can be superimposed on a frequency band of −50 dB or below presumed to have been lost due to compression, and acoustic quality correction can be performed without excessively affecting a frequency band in which a signal greater than or equal to −50 dB is included in the input signal.

At this time, weak signal component adding section 121 determines for which frequency band a weak signal component is to be generated by setting a frequency passband filter (filter coefficient) for an input audio signal. If this frequency passband filter is set to the low-tone range, tuning can be performed with acoustic quality correction determined for only the low-tone range, and the amount of computational processing can be reduced by limiting the frequency band. Also, weak signal component adding section 121 determines a band to which a weak signal component is to be added, by setting a frequency passband filter (filter coefficient) for a generated weak signal component. This can avoid excessive addition to the high-tone range, the excessive addition being caused by the generated weak signal components successively spreading up to a high-frequency band.

Also, in order to correct the output level of part (3) of the compressed signal shown in FIG. 2 (*b*), based on the inputted audio signal, high-frequency band audio adding section 122 adds high-frequency band audio including a harmonics signal to the compressed signal (input audio signal), the harmonics signal including a high harmonic component or the like or a noise signal by means of half-wave rectification and waveform clipping as shown in FIG. 2 (*d*).

Since a frequency band deleted during compression differs according to the file type and compression rate, the passband filter determines a frequency band of audio to be added according to the deleted frequency. For example, in the case of a 128 kbps MP3 type file, a passband filter for added audio is set to 16 kHz or above. The amount of added audio is set so that signal components included in input audio and added audio are smoothly consecutive.

A weak signal component added by weak signal component adding section 121 in the interior of a vehicle will be described below.

Normally, when an input level greater than or equal to a determined value is detected in all hands in the interior of a vehicle, it may be considered to be possible to correct a part lost in a compressed signal and improve acoustic quality by performing processing that generates and adds a weak signal component. However, in reality, in the interior of a vehicle, acoustic quality does not improve but actually degrades.

This is caused by vehicle-interior characteristics indicating distinctive characteristics as interior characteristics. That is to say, with vehicle-interior characteristics, different characteristics are demonstrated for different vehicles according to the speaker arrangement, seat material, area of glass, and so forth.

For example, frequency bands in which there are peaks and dips at resonance points differ for different vehicles. In such circumstances, if weak signal component addition is performed by weak signal component adding section 121 in all bands, an undesirable situation will occur such as a weak signal component being further added to a frequency band in which there is a peak at a resonance point, or only little weak signal component addition being performed for a frequency band in which there is a dip at a resonance point. In such circumstances, the balance of bands is lost, and acoustic quality becomes extremely poor.

Thus, acoustic quality is dramatically improved by having weak signal component added by weak signal component adding section 121 in accordance with vehicle-interior characteristics. For example, a frequency passband filter is set so as to suppress addition of a weak signal component at a peak at a resonance point due to a vehicle-interior characteristic, and to promote addition of a weak signal component at a clip at a resonance point.

A frequency passband filter may be set for an input audio signal, or may be set for a generated weak signal component. Also, since the fundamental frequency band of a main musical instrument (bass drum, vocal, piano, guitar, cymbals, etc.) is known, selecting this fundamental frequency band when setting a frequency passband filter is effective in improving acoustic quality.

Setting a frequency passband filter in this way not only improves acoustic quality but at the same time also enables the amount of signal processing to be reduced. In particular, when processing that adds high-frequency band audio is also performed simultaneously by high-frequency band audio adding section 122, it is necessary for these processing procedures to be performed simultaneously in real time, and the amount of signal processing is normally enormous.

Also, in recent years vehicle models such as minivans have appeared that allow various seating modes including seat arrangements. However, vehicle-interior characteristics also differ according to the seating mode, and the acoustic quality of reproduced sound of compressed audio may be degraded by the addition of a weak signal component by weak signal component adding section 121. Consequently, acoustic quality varies significantly, and operability may suffer, according to differences in the seating mode. Thus, it is possible to maintain acoustic quality regardless of the seating mode if frequency passband filter control parameters are held in storage section 107 beforehand for each seating mode, and microcomputer 106 issues a directive for changing a frequency passband filter control parameter to weak signal component adding section 121 according to the seating mode.

Next, the operation of in-vehicle audio apparatus 100 having the above configuration will be described using FIG. 3.

Figure 3:
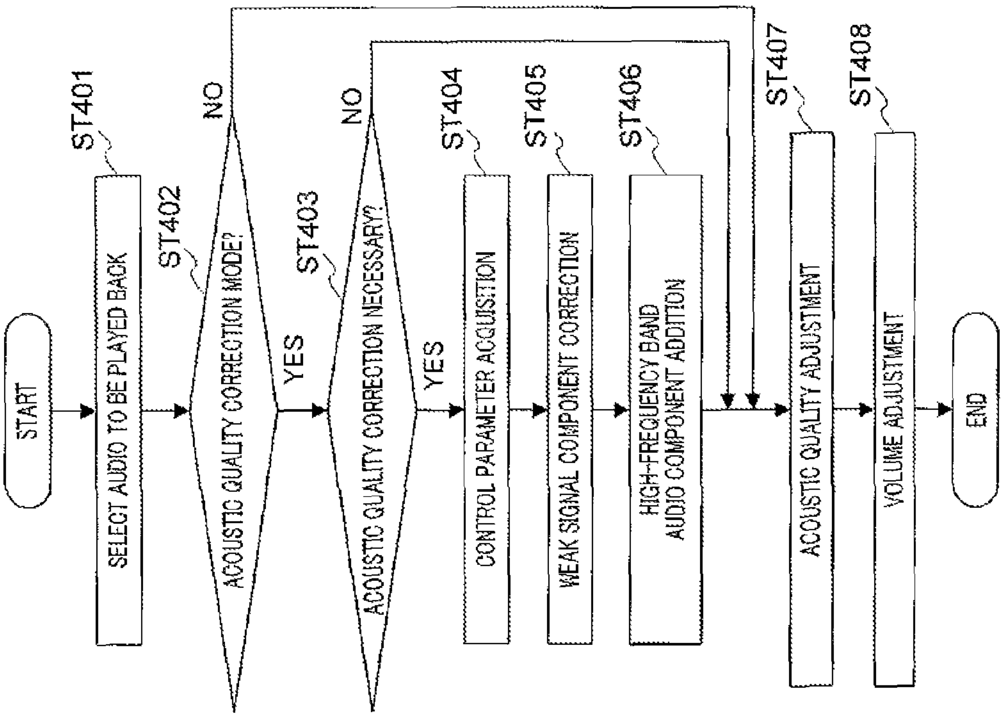
FIG. 3 is a flowchart showing the operation of the in-vehicle audio apparatus shown in FIG. 1.

In FIG. 3, in step (hereinafter abbreviated to "ST") 401, the user selects what audio is to be played back. Here, the kinds of audio that can be selected are radio broadcast audio, reproduced sound of audio information recorded on a disk-shaped recording medium such as a CD or DVD, or audio recorded on a recording medium in external device 300 or the like. Through operation of operating section 104, the user can freely switch the audio to be played back, and microcomputer 106 recognizes what audio is being played back.

In ST402, microcomputer 106 determines whether or not audio control section 102 has been set to acoustic quality correction mode in which audio control section 102 performs acoustic quality correction, and if the mode is acoustic quality correction mode (YES) the processing flow proceeds to ST403, whereas if the mode is not acoustic quality correction mode (NO) the processing flow proceeds to ST407.

In ST403, microcomputer 106 determines whether or not the audio selected in ST401 is audio requiring acoustic quality correction. That is to say, microcomputer 106 determines whether or not compressed audio is to be played back. If it is determined that the audio is audio for which acoustic quality correction is necessary (YES), the processing flow proceeds to ST404, whereas if it is determined that the audio is audio for which acoustic quality correction is not necessary (NO) the processing flow proceeds to ST407.

In ST404, microcomputer 106 acquires from storage section 107 a control parameter based on the magnitude of the current playback volume and the type of the audio. Now, a large magnitude of a current playback volume is defined as below. For example, if additive gain due to acoustic quality correction is set to 6 dB, and volume adjustment is set higher than −6 dB, the audio exceeds 0 dB. Therefore, the audio is clipped and distortion is generated. In order to prevent this, a margin equivalent to the additive gain due to acoustic quality correction is saved. The large magnitude of the playback volume, is defined as a volume in which the margin cannot be saved.

In ST405, weak signal component adding section 121 uses the control parameter acquired in ST404 and the inputted audio signal to generate a weak signal component including a harmonics signal including a high harmonic component or the like or a noise signal, and adds this to the original audio signal.

In ST406, high-frequency band audio adding section 122 uses the control parameter acquired in ST404 and the inputted audio signal to generate high-frequency band audio not included in the original audio signal, including a harmonic signal including a high-frequency component or the like or a noise signal, and adds this generated audio to the original audio signal.

In ST407, acoustic quality adjustment section 123 performs acoustic quality adjustments such as equalizing, low-tone range adjustment, high-tone range adjustment, front/back volume balance, and left/right audio balance.

In ST408, volume adjustment section 124 adjusts the volume of the audio signal and outputs audio from speaker 200 via amplifier 103.

Thus, according to this embodiment, by adding a weak signal component and high-frequency band audio that are audio components lost through compression to an inputted compressed audio signal, it is possible to approach audio that is close to pre-compression audio, and a compressed audio signal being played back can be sufficiently comfortable to be audible even in a playback environment with improved acoustic quality.

Also, by determining the type of inputted audio and determining whether or not acoustic quality adjustment is necessary software control programmed in microcomputer 106, microcomputer 106 can generate a weak signal component and high-frequency band audio automatically without the need for a user operation.

In this embodiment, audio playback section 101 is provided with disk playback section 110 provided with an optical pickup, turntable, and so forth, necessary for playing back audio information recorded on a disk-shaped recording medium such as a CD or DVD, radio tuner section 111 for receiving radio broadcast such as an FM or AM, and media playback section 112 for playing back audio information recorded on a recording medium such as an SD or memory card, but a configuration may be used in which disk playback section 110, radio tuner section 111, and media playback section 112 are all provided in audio playback section 101, or a configuration may be used in which any of these is provided.

In-vehicle audio apparatus 100 of the present invention has a configuration whereby microcomputer 106 can determine the playback volume. By means of this configuration, the amount of control of audio control section 102 can be attenuated as the playback volume increases, and maximum digital amplitude output is possible without generating audio distortion due to digital computation overflow in audio control section 102.

The disclosure of Japanese Patent Application No. 2010-078518, filed on Mar. 30, 2010, including the specification, drawings and abstract, is incorporated herein by reference in its entirety.

INDUSTRIAL APPLICABILITY

An audio apparatus according to the present invention is suitable for use in a vehicle or the like.

REFERENCE SIGNS LIST

100 In-vehicle audio apparatus
101 Audio playback section
102 Audio control section
103 Amplifier
104 Operating section
105 Display section
106 Microcomputer
107 Storage section
110 Disk playback section
111 Radio tuner section
112 Media playback section
120 Input switching section
121 Weak signal component adding section
122 High-frequency band audio adding section
123 Acoustic quality adjustment section
124 Volume adjustment section
200 Speaker
300 External device

The invention claimed is:

1. An audio apparatus that receives a compressed audio signal, comprising:

a weak signal component adding section that generates a weak signal component that is not included in the compressed audio signal, and adds the generated weak signal component to the compressed audio signal; and a high-frequency band audio adding section that generates high-frequency band audio that is not included in the compressed audio signal, and adds the generated high-frequency band audio to the compressed audio signal, wherein the weak signal component adding section generates a weak signal component for the audio signal for which a frequency passband filter appropriate to an interior characteristic has been set, wherein the interior characteristic is an interior characteristic in a vehicle, and wherein the vehicle has variable seating modes, and the audio apparatus includes:

a storage section that holds a control parameter of the frequency passband filter for each seating mode; and a microcomputer that directs the weak signal component adding section to apply a control parameter of the frequency passband filter based on a current seating mode.

2. The audio apparatus according to claim 1, wherein the weak signal component adding section sets the frequency passband filter appropriate to the interior characteristic for the generated weak signal component.

3. The audio apparatus according to claim 1, wherein the frequency passband filter suppresses the weak signal component that is added to a peak part of a resonance point in the interior characteristic.

4. The audio apparatus according to claim 1, wherein the frequency passband filter promotes addition of the weak signal component to a dip part of a resonance point in the interior characteristic.

5. The audio apparatus according to claim 1, wherein the frequency passband filter passes a fundamental frequency band of a musical instrument.

* * * * *